United States Patent [19]
Monma

[11] Patent Number: 5,804,288
[45] Date of Patent: Sep. 8, 1998

[54] ALUMINUM NITRIDE WIRING SUBSTRATE

[75] Inventor: Jun Monma, Yokohama, Japan

[73] Assignee: Kabushiki Kaisha Toshiba, Kanagawa-ken, Japan

[21] Appl. No.: 366,320

[22] Filed: Dec. 28, 1994

[30] Foreign Application Priority Data

Dec. 29, 1993 [JP] Japan ................................ 5-353497

[51] Int. Cl.$^6$ .................................................. B32B 9/00
[52] U.S. Cl. ........................ 428/209; 428/210; 428/901
[58] Field of Search ................................ 428/209, 210, 428/901; 501/96; 252/514, 578; 361/748

[56] References Cited

U.S. PATENT DOCUMENTS

| | | | |
|---|---|---|---|
| 4,861,641 | 8/1989 | Foster | 428/209 |
| 4,871,608 | 10/1989 | Kondo | 428/209 |
| 5,124,284 | 6/1992 | Ishida | 501/96 |
| 5,167,869 | 12/1992 | Nebe | 252/514 |
| 5,229,213 | 7/1993 | Horivchi | 428/901 |
| 5,271,962 | 12/1993 | Alexander | 252/578 |
| 5,413,842 | 5/1995 | Felitsberto | 428/209 |

FOREIGN PATENT DOCUMENTS

| | | |
|---|---|---|
| 60-253294 | 12/1985 | Japan . |
| 1-300584 | 12/1989 | Japan . |
| 6-56563 | 3/1994 | Japan . |

*Primary Examiner*—Patrick Ryan
*Assistant Examiner*—Patrick Jewik
*Attorney, Agent, or Firm*—Finnegan, Henderson, Farabow, Garrett & Dunner, L.L.P.

[57] ABSTRACT

A formed aluminum nitride piece is produced by applying a wiring layer-forming metal paste containing such a high melting temperature metal (wiring metal) as tungsten, for example, to an aluminum nitride green sheet and shaping one layer of the aluminum nitride green sheet now bearing the applied metal paste or superposing a plurality of such layers. In this case, a manganese component destined to densify tungsten is incorporated in at least either of the green sheet and the wiring layer-forming metal paste. The manganese component is either manganese as a simple metallic element or such a manganese compound as manganese oxide. Then, the formed aluminum nitride piece is fired to effect simultaneous sintering of an aluminum nitride and tungsten. Owing to the preparatory addition of the manganese component, a complex compound such as a complex oxide containing manganese and tungsten or a complex such as a eutectic alloy of manganese and tungsten is formed in the wiring metal layer. The wiring metal layer contains manganese at a ratio of not more than 2% by weight in addition to tungsten. Since the complex accelerates the granular growth of tungsten, a tungsten layer (wiring metal layer) densified to an extent of lowering the porosity thereof below 2% is obtained.

13 Claims, 4 Drawing Sheets

ALUMINUM NITRIDE WIRING SUBSTRATE

BACKGROUND OF THE INVENTION

1. Field of the Invention

This invention relates to an aluminum nitride wiring substrate having a metallic wiring layer formed thereon by firing simultaneously with an aluminum nitride substrate and a method for the production thereof.

2. Description of the Related Art

Recently, the demands for ceramic substrates have been increasing year after year in consequence of the development of such semiconductor elements as power IC's and high frequency transistors which necessitate large volumes of electric current. Particularly, aluminum nitride substrates are characterized by high thermal conductivity, an excellent ability to radiate heat, etc. and, owing to these features, have been attracting attention as substrates capable of efficiently serving semiconductor elements which have been tending toward increasing capacities for heat radiation.

When the aluminum nitride substrate just mentioned is used as in a semiconducting package or a circuit substrate, the practice of collectively manufacturing the aluminum nitride substrate and a wiring metal layer by simultaneous firing is popularly followed.

The method generally adopted for the production of a simultaneously fired aluminum nitride substrate will be described below. First, a wiring layer-forming metallic paste containing a wiring metal is applied in a desired shape to a ceramic green sheet. By shaping one layer so obtained above or superposing a plurality of such layers in such a manner as to form a desired shape, a formed aluminum nitride piece is obtained. Then, this formed nitride piece is subjected to a degreasing treatment and thereafter fired at a prescribed temperature to sinter the aluminum nitride substrate and the wiring metal simultaneously.

As the wiring metal in the aforementioned simultaneously fired aluminum nitride substrate, one simple metallic element or an alloy composed of two or more metallic elements selected from among molybdenum, tungsten, platinum, manganese, etc. is use as disclosed in JP-A-60-253,294, for example. Among other examples cited above, tungsten is mainly used because it possesses a linear expansion coefficient similar to that of aluminum nitride. In the simultaneously fired aluminum nitride substrate under discussion, the union of the wiring metal of tungsten as with the aluminum nitride sinter is considered to be maintained by the anchoring effect that the composite oxide of a sintering auxiliary and aluminum oxide enters each other's textures.

Incidentally, the process for simultaneously firing the aluminum nitride substrate has the problem that since the sintering temperature of aluminum nitride and the densifying temperature of tungsten are different and further since aluminum nitride and tungsten are different in behavior of densification, the step of simultaneous firing tends to leave pores behind in the freshly formed wiring metal layer. It further has the problem that the union itself of aluminum nitride and tungsten grows unstable. These problems are similarly incurred when molybdenum and other metals are used in the form of a simple metallic element instead of tungsten. When an alloy of molybdenum or tungsten with manganese or other metallic element is used, the process entails the problem that the produced wiring metal layer tends to suffer from poor shape retention or wire breakage because of decrease in melting point.

Thus, the practice of incorporating aluminum nitride as a component and a sintering auxiliary component therefor in a printing composition to be used for the formation of a wiring metal layer thereby equalizing the coefficient of contraction of the sinter of aluminum nitride and that of the wiring metal and, at the same time, causing the aluminum nitride component to eliminate pores has been heretofore followed (refer to JP-A-01-300,584, for example). The densification of the wire metal layer has been devised as mentioned above.

When the printing composition of the wiring metal incorporates the aluminum nitride component and the sintering auxiliary component therein, however, the problem arises that the produced wiring tends to offer increased resistance in proportion as the amounts of these additives are increased. Further, when it incorporates therein the aluminum nitride component containing the sintering auxiliary component, it now contains a component destined to give rise to a liquid phase in the wiring metal layer in the process of sintering and the wiring metal layer to be obtained after the sintering tends to induce segregation of a liquid layer on or around the wiring metal layer. The produced substrate, therefore, is at a disadvantage in inducing abnormal plating or odd appearance. When the wiring metal layer has not been fully densified, the problem arises that in the heating test subsequent to the formation of a plating layer or a thin-film wiring layer, etc. thereon, defective expansion tends to occur in the plating layer-or the thin-film wiring layer, etc.

Separately, the method for densifying the wiring metal layer by filling the pores or the gaps existing in the wiring metal layer of the simultaneously fired aluminum nitride substrate with a metal deposited by the plating technique has been proposed (JP-A-06-56,563). This method is effective in filling such voids as mentioned above in the surface wiring layer. It is nevertheless at a disadvantage in failing to fill such voids uniformly with the metal by the plating technique as far as the inner wiring layer.

SUMMARY OF THE INVENTION

It is an object of this invention, therefore, to provide an aluminum nitride wiring substrate having a wiring metal layer uniformly densified as far as the interior and, at the same time, having the wiring metal layer stably joined with an aluminum nitride substrate without entailing mixture of the substrate component with the wiring metal. Another object of this invention is to provide an aluminum nitride wiring substrate permitting prevention of the wiring metal layer from defective wire continuity or odd appearance and further prevention of the plating layer and the thin-film wiring layer superposed on the wiring metal layer from defective expansion. Yet another object of this invention is to provide a method for the production of an aluminum nitride wiring substrate, which method permits the aluminum nitride wiring substrate of the quality mentioned above to be produced with high repeatability.

The aluminum nitride wiring substrate of this invention is characterized by comprising an aluminum nitride substrate and a wiring metal layer provided in at least either of the surface and the interior of the aluminum nitride substrate, formed by being simultaneously fired with the aluminum nitride substrate, and made to contain not more than 2% by weight of manganese in addition to the metal as a main component of the wiring metal layer.

The other aluminum nitride wiring substrate of the present invention is characterized by comprising an aluminum nitride substrate and a wiring metal layer provided in at least either of the surface and the interior of the aluminum nitride substrate, a porosity of said wiring metal layer being not more than 2%.

The method of this invention for the production of a simultaneously fired aluminum nitride substrate is characterized by comprising a step of applying a wiring layer-forming metal paste containing a wiring metal in a desired shape to an aluminum nitride green sheet while causing at least one manganese component selected from the group consisting of manganese and manganese compounds to be incorporated in at least either of the aluminum nitride green sheet and the wiring layer-forming metal paste, a step of fabricating a formed aluminum nitride piece by shaping one layer of the aluminum nitride green sheet or superposing a plurality of layers thereof, and a step of firing the formed aluminum nitride piece thereby simultaneously sintering an aluminum nitride and the wiring metal.

In this invention, either the aluminum nitride green sheet or the wiring layer-forming metal paste incorporates therein manganese or a manganese compound which is destined to react with the metal constituting a main component of the wiring metal layer and consequently densify the wiring metal layer. Owing to the manganese or manganese compound so incorporated, the wiring metal is made to undergo accelerated granular growth and gradual densification of texture. This densification of the wiring metal layer is substantially completed while the wiring metal layer is undergoing simultaneous firing with the aluminum nitride. As a result, the wiring metal layer having a porosity of not more than 2%, for example, can be obtained without requiring incorporation of either an aluminum nitride component or a sintering auxiliary component. Further, since the sintering of the wiring metal is consequently accelerated, the wiring metal which has undergone the densification to an advanced extent during the sintering of aluminum nitride is eventually embraced by the aluminum nitride. As a result, the property of union between the aluminum nitride and the wiring metal layer is improved.

When the wiring metal layer is densified to such an extent as to lower the porosity thereof to below 2%, the otherwise possible ingress of a liquid component or an organic impurity component into the wiring metal layer in the process of plating or thin-film formation subsequent to the step of firing can be precluded. As a result, the aluminum nitride wiring substrate excelling in reliability can be provided because the factors for such defects as occurrence of decomposition gas components and abnormal expansion due to the heat treatment involved in the inspection of product are avoided.

DESCRIPTION OF THE PREFERRED EMBODIMENTS

Now, the present invention will be described more specifically below with reference to working examples thereof.

Figure 1:
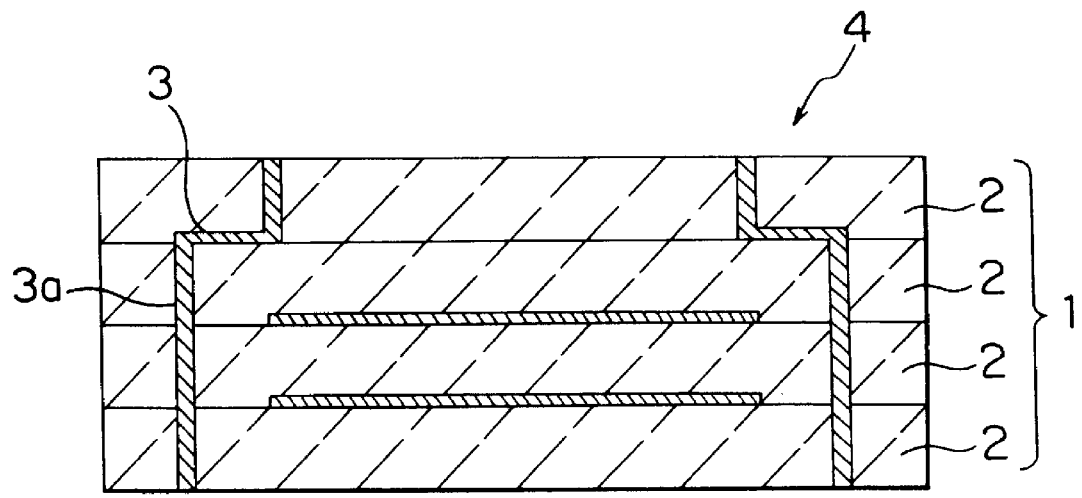
FIG. 1 is a cross section illustrating with a model the construction of an aluminum nitride wiring substrate according to one working example of this invention.

FIG. 1 is a cross section illustrating the construction of one working example of applying the present invention to an aluminum nitride wiring substrate obtained by simultaneous firing. In this diagram, 1 stands for a multilayer aluminum nitride substrate. This multilayer aluminum nitride substrate 1 is constructed by integrally superposing a plurality of aluminum nitride layers 2. On each of the aluminum nitride layers 2 is provided an inner wiring metal layer 3 having a prescribed wiring pattern. This inner wiring metal layer 3 includes a wiring metal layer 3a filled in a through hole.

The multilayer aluminum nitride substrate 1 so constructed and the inner wiring metal layers 3 jointly form a multilayer aluminum nitride wiring substrate 4. The multilayer aluminum nitride wiring substrate 4 is manufactured, for example, by firing simultaneously an aluminum nitride (multilayer aluminum nitride substrate 1) and a wiring layer-forming metallic material (an applied layer of a wiring layer-forming metal paste) destined to form an inner wiring metal layer 3.

The multilayer aluminum nitride substrate 1 is formed of an ordinary aluminum nitride sinter. The product obtained by mixing aluminum nitride powder with the powder of such a rare earth oxide as yttrium oxide or aluminum oxide powder as a sintering auxiliary and sintering the resultant mixed powder may be cited as a concrete example. It is also permissible to adopt instead a low temperature firing aluminum nitride using, as a sintering auxiliary, such a fluoride as yttrium fluoride or calcium fluoride.

The inner wiring metal layer 3 is desired to be formed of a metallic material containing substantially no inorganic insulating substance such as aluminum nitride component or sintering auxiliary component. As concrete examples of the metal mainly forming the inner wiring metal layer 3, such high melting metals as tungsten and molybdenum may be cited. These high melting metals may be used either singly or in the form of a mixture with such an active metal as titanium or zirconium or with such an active metal compound as titanium nitride. In this invention, it is particularly desirable to use as the main component of the inner wiring metal layer 3 tungsten which has a thermal expansion coefficient approximating that of aluminum nitride. The tungsten powder which is used in the preparation of the wiring layer-forming metal paste is desired to have a relatively large particle diameter in the approximate range of from 5 to 20 $\mu$m. Thus, the wiring metal can be precluded from shrinkage.

The inner wiring metal layer 3 mentioned above contains a very minute amount of manganese in addition to the metal such as, for example, tungsten which mainly forms the inner wiring metal layer 3. The manganese which is contained in the inner wiring metal layer 3 originates in the manganese component which is preparatorily incorporated in the aluminum nitride green sheet used for the formation of the multilayer aluminum nitride substrate 1 or the wiring layer-forming metal paste. As concrete examples of the manganese component, manganese as a simple metallic element or manganese compounds such as manganese oxide may be cited.

Manganese oxide, for example, and tungsten react with each other in the process of simultaneous sintering to form such a complex compound as complex oxide containing manganese and tungsten or a complex such as a eutectic alloy of manganese and tungsten. The complex (compound) forms a liquid phase in the process of simultaneous sintering. Through the medium of this liquid phase, the tungsten atoms which have not been easily sintered or diffused can be rendered easily diffusible. As a result, the tungsten particles can be made to undergo accelerated granular growth and the tungsten wiring layer (inner wiring layer 3) can be thoroughly densified. In consequence of this process of densification, the inner wiring metal layer 3 having a porosity of not more than 2% can be produced.

The effect of densification mentioned above is accomplished by the fact that the inner wiring metal layer 3 contains a complex containing a wiring metal and manganese both in very minute amounts. If the inner wiring metal layer 3 contains manganese in a proportion exceeding 2% by weight, the possibility will arise that the wiring metal (such as, for example, tungsten) melts to an advanced extent, the inner wiring metal layer 3 ceases to exhibit the shape-retaining property, and the aluminum nitride substrate 1 succumbs to deterioration of properties. It is, therefore, desirable to confine the manganese content of the inner wiring metal layer 3 within 2% by weight. If the manganese content in the inner wiring metal layer 3 is unduly small, the wiring metal will not be densified fully satisfactorily. Thus, the manganese content of the inner wiring metal layer 3 is desired to be not less than 0.01% by weight. Preferably, the manganese content is in the range of from 0.01 to 1.0% by weight.

The range of the manganese content in the inner wiring metal layer 3 mentioned above applies where an ordinary aluminum nitride substrate is used. In other words, this is the case in which the aluminum nitride substrate is produced by the firing to be given at a temperature in the approximate range of from 2023 to 2123 K. Where a special aluminum nitride substrate is used, it is desired to set this manganese content in compliance with such factors as the firing temperature and the firing time. In the case of low temperature firing aluminum nitride which can be fired at a temperature of not more than 1873 K, for example, it is desirable to set the manganese content of the inner wiring metal layer 3 in the range of from 0.1 to 2% by weight.

Though the densification of the inner wiring metal layer 3 can be attained likewise whether the manganese component is incorporated in the aluminum nitride green sheet or in the wiring layer-forming metal paste as described above, it is particularly desirable to effect this incorporation on the green sheet side. When the manganese component is incorporated on the green sheet side, the union between the aluminum nitride substrate 1 and the inner wiring metal layer 3 can be fortified because the linkage with the inner wiring metal layer (such as, for example a tungsten layer) 3 is issued from the aluminum nitride substrate side. Further, the uniformity of the density of the inner wiring metal layer 3 can be exalted because the distribution of the manganese component is more readily uniformized in the green sheet.

In the multilayer aluminum nitride substrate 4 of the present embodiment, the inner wiring metal layer 3 such as, for example, a tungsten layer which is amply densified to such an extent as to lower the porosity below 2% can be obtained because the wiring metal is made to succumb to accelerated granular growth and the wiring metal is sintered at an increased speed as described above. Further, in consequence of the increase in the sintering speed of the wiring metal, the property of union between the multilayer aluminum nitride substrate 1 and the inner wiring metal layer 3 can be stabilized because the wiring metal which has been densified to an advanced extent is eventually embraced by the sintered aluminum nitride.

The inner wiring metal layer 3 which has been densified to a fully satisfactory extent can be precluded from the factors for such defects as occurrence of decomposition gas components and abnormal expansion due to the heat treatment involved in the inspection of product because it defies ingress of a liquid component or an organic impurity component when a plating layer or a thin film is superposed thereon. Further, the inner wiring metal layer 3 enjoys low resistance and good appearance because it does not contain such unnecessary substances as aluminum nitride component and sintering auxiliary component which are responsible for inferior line continuity or bad appearance.

The aluminum nitride wiring substrate of the embodiment described thus far is produced, for example, as follows.

First, an aluminum nitride green sheet containing a manganese component capable of reacting with the wiring metal mentioned above and consequently densifying it or an ordinary aluminum nitride green sheet is prepared. Through holes are formed at prescribed positions in the aluminum nitride green sheet. As concrete examples of the manganese component which is incorporated in the aluminum nitride green sheet, manganese as a simple metallic element and manganese compounds such as manganese oxide may be cited.

The amount of the manganese component to be incorporated in the aluminum nitride green sheet is desired to be in the approximate range of from 0.05 to 5 mol %. If the amount of the manganese component is unduly small, the densification of the wiring metal (such as, for example, tungsten) will not be made to proceed fully satisfactorily. Conversely, if the amount is unduly large, the wiring metal will dissolve to an advanced extent, the inner wiring metal layer will cease to exhibit the shape-retaining property, and the aluminum nitride substrate will succumb to deterioration of properties.

When the green sheet contains the manganese component, an ordinary wiring layer-forming metal paste is applied in a desired wiring shape. The through holes are filled with the wiring layer-forming metal paste. The wiring layer-forming metal paste is obtained by adding an organic binder or a solvent to the powder of such a high melting metal as tungsten and mixing them until impartation of flowability to the product of the mixture. When the green sheet containing no manganese component is used, the wiring layer-forming metal paste is made to incorporate a manganese component therein and the resultant mixture is applied in a desired wiring shape to the green sheet and, at the same time, used to fill the through holes. When the manganese component is incorporated in the wiring layer-forming metal paste, the amount thereof is desired to be approximately 1/10 to 1/50 of the amount to be incorporated in the green sheet.

A formed aluminum nitride piece is produced by superposing as many aluminum nitride green sheets coated with the wiring layer-forming metal paste as required. Then, the formed aluminum nitride piece is given a degreasing treatment and fired in such a non-oxidizing atmosphere as an atmosphere of nitrogen so as to effect simultaneous sintering of the aluminum nitride wiring and the wiring metal. Thus, the multilayer aluminum nitride substrate 4 is obtained.

Figure 2:
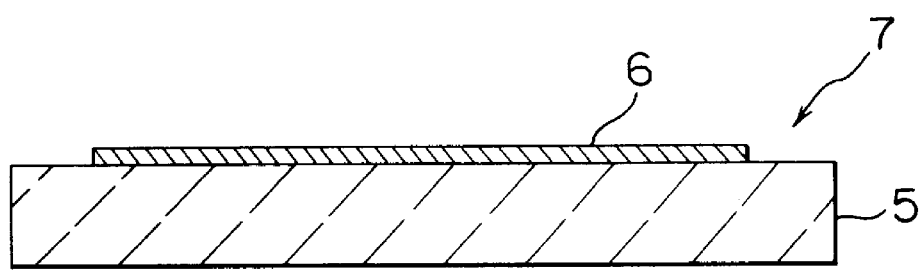
FIG. 2 is a cross section illustrating with a model the construction of an aluminum nitride wiring substrate according to another working example of this invention.

The aluminum nitride wiring substrate of this invention can be embodied in an aluminum nitride surface wiring substrate 7 which has a wiring metal layer 6 provided on the surface of an aluminum nitride substrate 5 as illustrated in FIG. 2. In this case, the surface wiring metal layer 6 resembles the multilayer aluminum nitride substrate mentioned above in containing a very minute amount of a composite which contains at least a metal such as, for example, tungsten as a main component thereof and manganese. The composite contributes to densify the surface wiring metal layer 6 as by lowering the porosity of the surface wiring layer 6 below 2%. As in the case of the multilayer aluminum nitride substrate, the manganese component is preparatorily incorporated in the aluminum nitride green sheet to be used for the formation of the aluminum nitride substrate 5 or the metal paste to be used for the formation of the surface wiring metal layer 6. It should be noted that this invention is particularly effective for the aluminum nitride wiring substrate provided with an inner wiring metal layer which is not easily densified.

As described above, the aluminum nitride surface wiring substrate 7 is enabled to endow the surface wiring metal layer 6 with density enough to lower the porosity below 2% owing to the presence of the composite containing at least the wiring metal and manganese. Further, the property of union between the aluminum nitride substrate 5 and the surface wiring metal layer 6 is likewise enabled to be stabilized.

The surface wiring metal layer which has been thoroughly densified as described above can be precluded from the factors for such defects as occurrence of decomposition gas components and abnormal expansion due to the heat treatment because it defies ingress of a liquid component or an organic impurity component when a plating layer or a thin film is superposed thereon. Further, the surface wiring metal layer 6 enjoys low resistance and good appearance because it does not contain such unnecessary substances as aluminum nitride component and sintering auxiliary component which are responsible for inferior line continuity or bad appearance.

This invention can be embodied in the aluminum nitride wiring substrate which is provided with both an inner wiring metal layer and a surface wiring metal layer. It brings about an equal densifying effect on both the wiring layers.

Now, concrete examples of the aluminum nitride wiring substrate of the invention and the results of the evaluation thereof will be described below.

Example 1 and Comparative Example 1

First, manganese dioxide powder with an assay of 99% was prepared as a manganese compound. This manganese dioxide powder was added to an aluminum nitride green sheet-forming slurry in ratios of 2.5 mol %, 0.75 mol %, and 0.25 mol % relative to the aluminum nitride. The green sheet-forming slurry was prepared by using a raw material powder of aluminum nitride containing 5% by weight of yttrium oxide as a sintering auxiliary. Since the manganese dioxide powder originally had a coarse particle diameter, it was pulverized with a pot mill and then passed through a filter before incorporation in the green sheet-forming slurry. From the green sheet-forming slurries thus prepared, necessary numbers of aluminum nitride green sheets were severally manufactured.

Through holes were formed in each of the aluminum nitride green sheets and were filled with tungsten paste. Further, the tungsten paste was applied by printing to the surfaces of the aluminum nitride green sheets. Then, formed laminates were manufactured by superposing the aluminum nitride green sheets. The formed laminates were degreased in a current of nitrogen gas. The tungsten paste incorporated no aluminum nitride component but contained tungsten powder alone as an inorganic component. This composition of the tungsten paste was intended to permit better comprehension of the effect of manganese dioxide on the wiring metal.

Thereafter, the degreased laminates were set in place inside a firing jig made of aluminum nitride and fired therein as enclosed in nitrogen gas at 2093 K to effect simultaneous firing of aluminum nitride and tungsten and obtain aluminum nitride wiring substrates.

For comparison with this invention, simultaneously fired substrates of aluminum nitride and tungsten (aluminum nitride wiring substrates) were produced by following the procedure of the example cited above while omitting the incorporation of manganese dioxide in the aluminum nitride green sheets. The simultaneously fired substrates of this Comparative Example 1 had been obtained in the same furnace at the same time as in Example 1.

Figure 3:
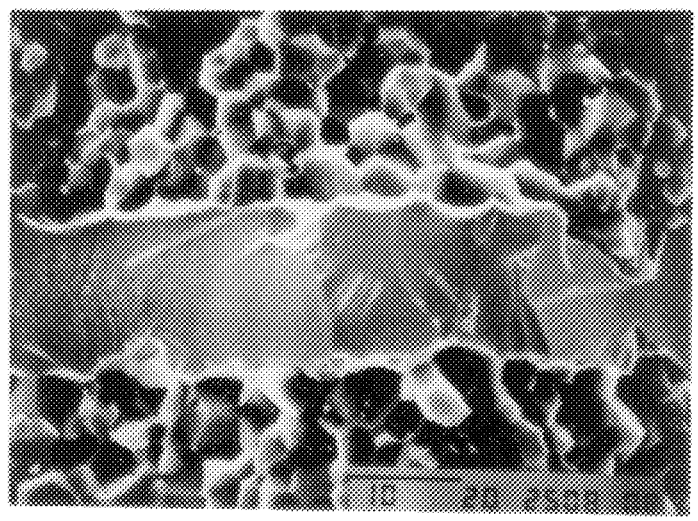
FIG. 3 is a scanning electron micrograph illustrating in a magnified scale the cross-sectional construction of an inner wiring layer part of an aluminum nitride wiring substrate according to Example 1 of this invention.
Figure 4:
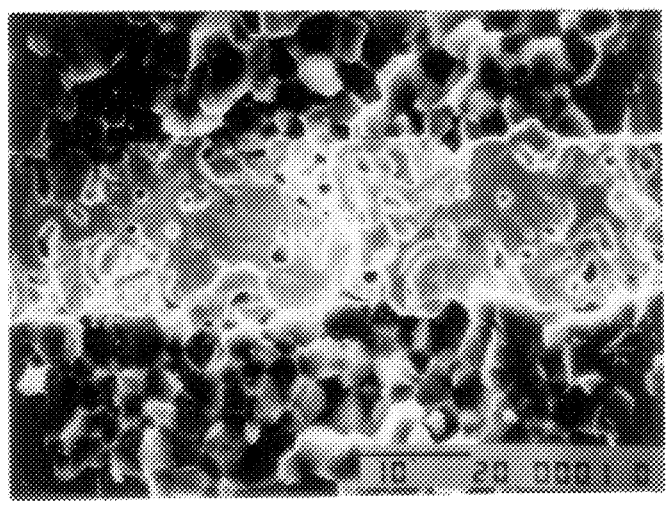
FIG. 4 is a scanning electron micrograph illustrating in a magnified scale the cross-sectional construction of an inner wiring layer part of an aluminum nitride wiring substrate according to Comparative Example 1.

To evaluate the wiring metal layers (tungsten layers) of the aluminum nitride wiring substrates obtained in Example 1 and Comparative Example 1 obtained as described above with respect to the inner sintering conditions, the cross-sectional structures thereof were observed under a scanning electron microscope. FIG. 3 is a scanning electron micrograph illustrating the cross-sectional microstructure of an inner wiring part of a sample of Example 1 (incorporating manganese dioxide powder at a ratio of 2.5 mol %). FIG. 4 is a scanning electron micrograph illustrating the cross-sectional microstructure of an inner wiring part of a sample of Comparative Example 1.

It is clearly noted from FIG. 3 that in the aluminum nitride wiring substrate (Example 1) using a manganese dioxide-containing aluminum nitride green sheet, the inner wiring part was densified thoroughly to give a one-piece wiring metal layer containing virtually no pore. The wiring metal layer was amply wetted with the enveloping aluminum nitride layer, indicating satisfactory tightness of adhesion. In the samples of aluminum nitride wiring substrates which used aluminum nitride green sheets incorporating manganese dioxide powder at ratios of 0.75 mol % and 0.25 mol %, the inner wiring parts were similarly densified sufficiently to give one-piece wiring metal layers containing virtually no pore.

It is clearly remarked from FIG. 4, in the samples of aluminum nitride wiring substrates which used aluminum nitride green sheet incorporating no manganese dioxide, the inner wiring layers suffered existence of numerous pores. The tightness of adhesion to the enveloping aluminum nitride layer was not observed to be satisfactory owing to the existence of pores.

Figure 5:
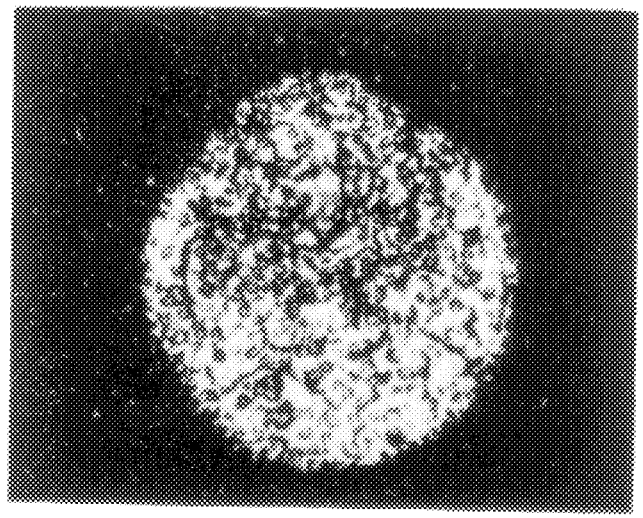
FIG. 5 is an optical photomicrograph illustrating in a magnified scale the microstructure of a surface part of a wiring metal layer in the aluminum nitride wiring substrate according to Example 1 of this invention.
Figure 6:
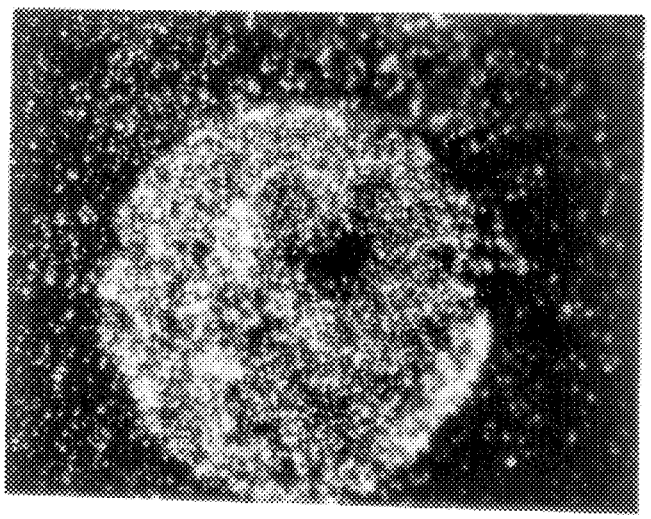
FIG. 6 is an optical photomicrograph illustrating in a magnified scale the microstructure of a surface part of a wiring metal layer in the aluminum nitride wiring substrate according to Comparative Example 1.

Further, the surface parts of through holes in the aluminum nitride wiring substrates obtained in Example 1 and Comparative Example 1 were observed under an optical microscope (500 magnifications). FIG. 5 is an optical photomicrograph illustrating in a magnified scale the microstructure of a through hole surface of a sample of Example 1 (incorporating manganese dioxide power at a ratio of 2.5 mol %). FIG. 6 is an optical photomicrograph illustrating in a magnified scale the microstructure of a through hole surface of a sample of Comparative Example 1.

From comparison of FIG. 5 and FIG. 6, it is clearly noted that in the through hole of the aluminum wiring substrate (Example 1) incorporating manganese dioxide, tungsten underwent granular growth and enjoyed densification to an advanced extent.

From FIG. 6, it is clearly remarked that in the aluminum nitride wiring substrate obtained in Comparative Example 1, the tungsten underwent no sufficient granular growth and suffered presence of numerous pores and, therefore, permitted easy ingress of a liquid component and an organic component into the pores. The ingress of such impurity components as mentioned above form direct causes for inducing expansion of plating metal and abnormal occurrence of component gases as in the process of a heat treatment to be performed in the packaging of the substrate in a semiconducting element. In the aluminum nitride wiring substrate of Example 1, the wiring metal layer encountered absolutely no permeation of any impurity component and the heat treatment performed after the step of plating brought about no abnormal phenomenon of any sort because the wiring layer was densified.

The scanning electron micrographs of the cross sections of the wiring metal layers in the samples of the aluminum nitride wiring substrates obtained in Example 1 and Comparative Example 1 were subjected to image determining to determine the amounts of pores remaining in the cross-section parts of the inner wiring layers (residual porosity). These residual porosities were found for the component layers of each multilayer aluminum nitride substrate. The results are shown in Table 1.

TABLE 1

|  | $MnO_2$ | Residual porosity (%) | | |
| --- | --- | --- | --- | --- |
|  | (mol %) | 2nd layer | 3rd layer | 5th layer |
| Example 1 | 2.5 | 0.5 | 0.7 | 0.6 |
|  | 0.75 | 0.7 | 0.6 | 0.8 |
|  | 0.25 | 1.2 | 0.8 | 1.0 |
| Comparative Example 1 | None | 5 | 8 | 7 |

The wiring metal layers in the aluminum nitride wiring substrates obtained in Example 1 and Comparative Example 1 were subjected to EPMA analysis to determine their contents of component elements. The results are shown in Table 2.

TABLE 2

|  | $MnO_2$ | Component elements of wiring layer (wt %) | | | |
| --- | --- | --- | --- | --- | --- |
|  | (mol %) | W | Mn | Al | Y |
| Example 1 | 2.5 | 99.0 | 1.0 | — | — |
|  | 0.75 | 99.2 | 0.77 | — | — |
|  | 0.25 | 100 | 0 | — | — |
| Comparative Example 1 | None | 76.8 | 0 | 7.0 | 16.2 |

In the aluminum nitride wiring substrate incorporating manganese dioxide at a ratio of 0.25 mol %, no Mn was detected by the EPMA analysis probably because of the outcome of linear analysis. Incidentally, according to the outcome of planar analysis of EPMA, the largeness of Mn content in the sample under discussion as compared with the sample of Comparative Example 1 incorporating no manganese dioxide was confirmed. Also in the aluminum nitride wiring substrate incorporating manganese dioxide at a ratio of 0.25 mol %, the wiring metal layer (tungsten layer) was found to have been thoroughly densified, indicating full manifestation of the effect of the addition of manganese dioxide.

The wiring metal layer in the aluminum nitride wiring substrate obtained in Comparative Example 1 contained Y and Al. This fact may be logically explained by a postulate that the sintering (densification) of tungsten proceeded slowly and, as a result, the sintering auxiliary aided in promoting ingress of a liquid component from the aluminum nitride substrate side into the wiring metal layer. In the wiring metal layer of the aluminum nitride wiring substrate obtained in Example 1, neither Y nor Al was detected. This fact implies that the tungsten in Example 1 underwent accelerated sintering and enjoyed quick densification.

When the tungsten layer in the multilayer aluminum nitride substrate obtained in Example 1 was subjected to microfine region X-ray diffraction analysis to determine the composition, the occurrence of a complex oxide of manganese and tungsten was confirmed.

Example 2 and Comparative Example 2

An aluminum nitride green sheet-forming slurry was prepared from a raw material powder of aluminum nitride containing 5% by weight of yttrium oxide as a sintering auxiliary. A required number of aluminum nitride green sheets were manufactured from the green sheet-forming slurry.

Separately, manganese dioxide powder with an assay of 99% was prepared as a manganese compound. This manganese dioxide powder was added to a tungsten paste at a ratio of 0.05 mol % relative to tungsten and they were mixed together. Since the manganese dioxide powder had a coarse particle diameter, it was pulverized with a pot mill and then passed through a filter before it was mixed with the tungsten paste.

Through holes were formed in each of the aluminum nitride green sheets and were filled with tungsten paste including manganese dioxide powder. Further, the tungsten paste including manganese dioxide powder was applied by printing to the surfaces of the aluminum nitride green sheets. Then, formed laminates were manufactured by superposing the aluminum nitride green sheets and degreased in a current of nitrogen gas. Incidentally, the tungsten paste incorporated no aluminum nitride component and contained tungsten powder and manganese dioxide alone as an inorganic component. This composition of the tungsten paste was intended to permit better comprehension of the effect of manganese dioxide on the wiring metal.

Thereafter, the degreased laminates were set in place inside a firing jig made of aluminum nitride and fired therein as enclosed in nitrogen gas at 2093 K to effect simultaneous firing of aluminum nitride and tungsten and obtain aluminum nitride wiring substrates.

For comparison with this invention, simultaneously fired substrates of aluminum nitride and tungsten (aluminum nitride wiring substrates) were produced by following the procedure of the example 2 cited above while omitting the incorporation of manganese dioxide in the tungsten paste. The simultaneously fired substrates of this Comparative Example 2 had been obtained in the same furnace at the same time as in Example 2.

Figure 7:
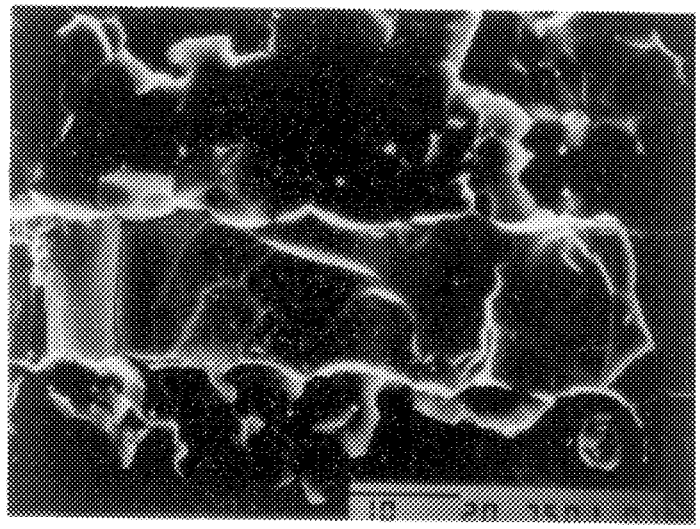
FIG. 7 is a scanning electron micrograph illustrating in a magnified scale the cross-sectional structure of an inner wiring layer part of an aluminum nitride wiring substrate according to Example 2 of this invention.
Figure 8:
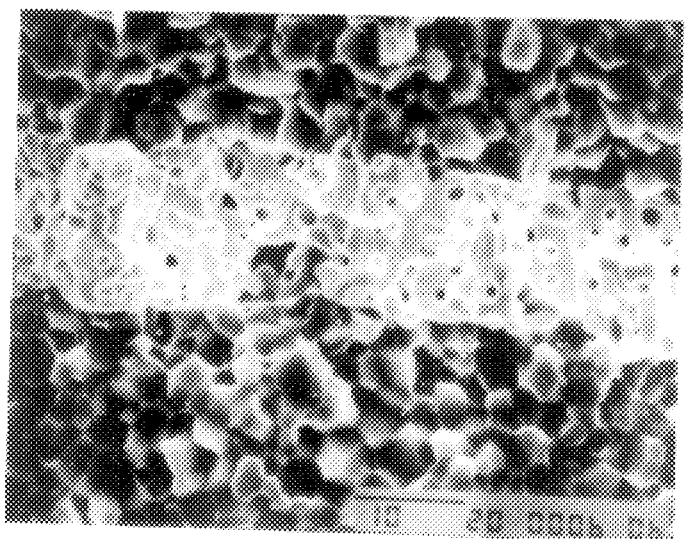
FIG. 8 is a scanning electron micrograph illustrating in a magnified scale the cross-sectional structure of an inner wiring layer part of an aluminum nitride wiring substrate according to Comparative Example 2.

To evaluate the wiring metal layers (tungsten layers) of the aluminum nitride wiring substrates obtained in Example 2 and Comparative Example 2 obtained as described above with respect to the inner sintering conditions, the cross-sectional structures thereof were observed under a scanning electron microscope. FIG. 7 is a scanning electron micrograph illustrating the cross-sectional microstructure of an inner wiring part of a sample of Example 2. FIG. 8 is a scanning electron micrograph illustrating the cross-sectional microstructure of an inner wiring part of a sample of Comparative Example 2.

It is clearly noted from FIG. 7 that in the aluminum nitride wiring substrate (Example 2) using a tungsten paste incorporating manganese dioxide, the inner wiring part was densified ample to give a one-piece wiring metal layer containing virtually no pore. The wiring metal layer was thoroughly wetted with the enveloping aluminum nitride layer, indicating satisfactory tightness of adhesion.

It is clearly remarked from FIG. 8, in the samples of aluminum nitride wiring substrates which used tungsten paste incorporating no manganese dioxide, the inner wiring layers suffered existence of numerous pores. The tightness of adhesion to the enveloping aluminum nitride layer was not observed to be satisfactory owing to the existence of pores.

The scanning electron micrographs of the cross sections of the wiring metal layers in the samples of the aluminum nitride wiring substrates obtained in Example 2 and Comparative Example 2 were subjected to image processing to determine the amounts of pores remaining in the cross-section parts of the inner wiring layers (residual porosity). These residual porosities were found for the component layers of each multilayer aluminum nitride substrate. The results are shown in Table 3.

TABLE 3

|  | Residual porosity (%) | | |
| --- | --- | --- | --- |
|  | 2nd layer | 3rd layer | 5th layer |
| Example 2 | 0.6 | 0.5 | 0.8 |
| Comparative Example 2 | 5 | 8 | 9 |

As clearly demonstrated in the working examples cited above, the wiring metal layer can be densified without inducing mixture of any of the substrate components in the wiring metal because the aluminum nitride green sheet or the wiring layer-forming metal paste incorporates manganese or a manganese compound. The union between aluminum nitride and the wiring metal can be stabilized as well. As a result, the wiring metal layer can be prevented from suffering such defects as inferior line continuity or bad appearance and the plated layer or the thin-film layer to be formed on the wiring metal layer can be precluded from succumbing to such abnormal phenomena as expansion. Thus, aluminum nitride wiring substrates fit for semiconductor packages and circuit substrates can be stably provided.

What is claimed is:

1. An aluminum nitride wiring substrate, comprising an aluminum nitride substrate and a wiring metal layer provided in at least either of the surface and the interior of said aluminum nitride substrate, the wiring metal layer being fired simultaneously with said aluminum nitride substrate, and comprising tungsten as a main component and manganese of not more than 2% by weight.

2. An aluminum nitride wiring substrate according to claim 1, wherein said wiring metal layer contain said manganese in an amount in the range of from 0.01 to 1% by weight.

3. An aluminum nitride wiring substrate according to claim 1, wherein said aluminum nitride substrate is made of a low temperature firing aluminum nitride and said wiring metal layer contain said manganese in an amount in the range of from 0.1 to 2% by weight.

4. An aluminum nitride wiring substrate, comprising an aluminum nitride substrate and a wiring metal layer provided in at least either of the surface and the interior of said aluminum nitride substrate, the wiring metal layer comprising tungsten as main component and having a porosity of not more than 2%.

5. An aluminum nitride wiring substrate according to claim 4, wherein the wiring metal layer comprising tungsten as a main component is composed of a metallic material containing substantially no inorganic insulating substance.

6. An aluminum nitride wiring substrate according to claim 4, wherein the wiring metal layer comprising tungsten as a main component is a fired metal layer which has been simultaneously sintered with said aluminum nitride substrate.

7. An aluminum nitride wiring substrate according to claim 4, wherein the wiring metal layer contains manganese of not more than 2% by weight.

8. An aluminum nitride wiring substrate according to claim 1, wherein an amount of said manganese in the wiring metal layer is not less than 0.01% by weight.

9. An aluminum nitride wiring substrate according to claim 1, wherein an amount of said manganese in the wiring metal layer is in the range from 0.01 to 1.0% by weight.

10. An aluminum nitride wiring substrate according to claim 1, wherein said wiring metal layer comprises an amount of manganese effective to decrease the porosity of said wiring metal layer to not more than 2%.

11. An aluminum nitride wiring substrate according to claim 4, wherein said wiring metal layer comprises an amount of manganese effective to decrease the porosity of said wiring metal layer to not more than 2%.

12. An aluminum nitride wiring substrate according to claim 4, wherein an amount of said manganese in the wiring metal layer is not less than 0.01% by weight.

13. An aluminum nitride wiring substrate according to claim 4, wherein an amount of said manganese in the wiring metal layer is in the range from 0.01 to 1.0% by weight.

* * * * *

UNITED STATES PATENT AND TRADEMARK OFFICE
CERTIFICATE OF CORRECTION

PATENT NO.: 5,804,288

DATED: September 8, 1998

INVENTOR(S): Monma

It is certified that an error appears in the above-identified patent and that said Letters Patent is hereby corrected as shown below:

Claim 2, column 12, line 10, "contain" should read --contains--.

Claim 3, column 12, line 16, "contain" should read --contains--.

Signed and Sealed this

Twelfth Day of October, 1999

Attest:

Q. TODD DICKINSON

Attesting Officer

Acting Commissioner of Patents and Trademarks